US012624280B2

(12) United States Patent
Seibald et al.

(10) Patent No.: US 12,624,280 B2
(45) Date of Patent: May 12, 2026

(54) RED LUMINESCENT MATERIAL AND CONVERSION LED

(71) Applicant: ams-OSRAM International GmbH, Regensburg (DE)

(72) Inventors: Markus Seibald, Kaufering (DE); Dominik Baumann, Munich (DE); Christiane Stoll, Schwabmuenchen (DE); Hubert Huppertz, Innsbruck (AT); Gunter Heymann, Hall in Tirol (AT)

(73) Assignee: ams-OSRAM International GmbH, Regensburg (DE)

( * ) Notice: Subject to any disclaimer, the term of this patent is extended or adjusted under 35 U.S.C. 154(b) by 755 days.

(21) Appl. No.: 17/919,552

(22) PCT Filed: Apr. 16, 2021

(86) PCT No.: PCT/EP2021/059855
§ 371 (c)(1),
(2) Date: Oct. 18, 2022

(87) PCT Pub. No.: WO2021/213900
PCT Pub. Date: Oct. 28, 2021

(65) Prior Publication Data
US 2023/0159822 A1 May 25, 2023

(30) Foreign Application Priority Data

Apr. 22, 2020 (DE) ..................... 10 2020 205 103.8

(51) Int. Cl.
*C09K 11/61* (2006.01)
*H10H 20/851* (2025.01)

(52) U.S. Cl.
CPC ....... *C09K 11/617* (2013.01); *H10H 20/8512* (2025.01)

(58) Field of Classification Search
CPC ........................... C09K 11/616; C09K 11/617
See application file for complete search history.

(56) References Cited

U.S. PATENT DOCUMENTS

2013/0306976 A1 * 11/2013 Haruta ................. H10H 20/817
257/76
2015/0123155 A1 5/2015 Schmidt et al.
(Continued)

FOREIGN PATENT DOCUMENTS

CN 105637063 A 6/2016
CN 108352430 A 7/2018
(Continued)

OTHER PUBLICATIONS

Stoll. HF-Free Synthesis of Li2SiF6: Mn4+: A red emitting phosphor. Inorganic Chemistry, US, 2019, vol. 58, Issue 9, pp. 5518-5523 (Year: 2019).*
(Continued)

*Primary Examiner* — Matthew E. Hoban
(74) *Attorney, Agent, or Firm* — Viering, Jentschura & Partner mbB

(57) ABSTRACT

A luminescent material may have an empirical formula $A_{1-y}A'_yLiXF_6:Mn^{4+}$, where:
A=Na, K, Rb, Cs, or combinations thereof;
A'=Na, K, Rb, Li, Cs, or combinations thereof;
X=Si, Ti, Hf, Zr, Sn, Pb, Ge, or combinations thereof;
$0 \leq y < 1$; and
A and A' are selected differently.

15 Claims, 5 Drawing Sheets

(56) References Cited

U.S. PATENT DOCUMENTS

| | | | |
|---|---|---|---|
| 2015/0132585 A1* | 5/2015 | Pan ...................... | C09K 11/617 |
| | | | 252/301.4 F |
| 2017/0306224 A1 | 10/2017 | Fiedler et al. | |
| 2020/0279978 A1 | 9/2020 | Pust | |
| 2021/0246369 A1 | 8/2021 | Seibald et al. | |

FOREIGN PATENT DOCUMENTS

| | | |
|---|---|---|
| CN | 109777418 A | 5/2019 |
| DE | 102018218159 A1 | 4/2020 |
| WO | 2013175336 A1 | 11/2013 |

OTHER PUBLICATIONS

International Search Report issued for the corresponding PCT patent application No. PCT/EP2021/059855, dated Jul. 1, 2021, 3 pages (For informational purposes only).

Ye, J., et al., "Narrow Red Emission Band Fluoride Phosphor KNaSiF 6 : Mn 4+ for Warm White Light-Emitting Diodes" Applied Materials & Interfaces, US, 2016, vol. 8, Issue 18, pp. 11194-11203.

Skarulis, J. A., et al., "Ternary systems: Walter-alkali metal hexafluorosilicates", Journal of chemical and Engineering Data, US, 1970, vol. 15, Issue 1, pp. 37-42.

Stoll, C., et al., "HF-Free Synthesis of Li 2 SiF 6 :Mn 4+ : A Red-Emitting Phosphor", Inorganic Chemistry, US, 2019, vol. 58, Issue 9, pp. 5518-5523.

Mengmeng, Z, et al., "Formation mechanism and optimized lumiescence of Mn 4+-doped unequal dual-alkaline hexafluorosilicate Li 0.5 NA 1.5 SiF 6", Journal of the American Ceramic Society, US, 2018, vol. 101, Issue 11, pp. 4983-4993.

Xi, Luqing et al.: "Room-temperature synthesis and optimized photoluminescence of a novel red phosphor NaKSnF6: Mn4+ for application in warm WLEDs", Journal of Materials Chemistry C, vol. 5, No. 36, Sep. 28, 2017, pp. 9255-9263.

Kavun, V. Y.: "Dynamics of Hexafluoroanions in Complexes of Tin and Titanium with Mixed Alkaline Metal Cations", Journal of Structural Chemistry, vol. 39, No. 1, 1998, pp. 49-52.

Chinese search report issued for the corresponding Chinese patent application No. 2021800300930, dated Aug. 22, 2023, 3 pages (four informational purposes only).

German search report issued for the corresponding German patent application No. 11 2021 002 599.6, dated Sep. 9, 2023, 5 pages (for informational purposes only).

Paulusz, A.G., "Efficient Mn (IV) Emission in Fluorine Coordination", Journal of the Electrochemical Society: Solid-State Science and Technology, 1973, vol. 120 No. 7, pp. 942-947.

Schmiechen, Sebastian et al., "Toward New Phosphors for Application in Illumination-Grade White pc-LEDs: The Nitridomagnesosilicates Ca[Mg3SiN4]:Ce3+, Sr[Mg3SiN4]:Eu2+, and Eu[Mg3SiN4]", Chemistry of Materials, dated 2014, retrieved from https://pubs.acs.org/doi/abs/10.1021cm500610vjournalCode= cmatex&quickLinkVolume=26&quickLinkPage=2712&selectedTab= citation&volume=26 on Jan. 23, 2023, pp. 2712-2719.

Hinteregger, Ernst et al., "Pressure-supported crystal growth and singlecrystal structure determination of Li2SiF6", De Gruyter, 2014, pp. 77-82 , vol. 229 No. 2, Zeitschrift fur Kristallographie— Crystalline Materials, DOI 10.1515/zkri-2013-1622.

Pust, Philipp et al., "Narrow-band red-emitting Sr[LiAl3N4]:Eu2+ as a next-generation LED-phosphor material", Nature Materials, Jun. 22, 2014, pp. 891-896, vol. 13, Macmillan Publishers Limited, DOI: 10.1038/NMAT4012.

Song, Enhai et al., "Highly Efficient and Stable Narrow-Band Red Phosphor Cs2SiF6:Mn4+ for High-Power Warm White LED Applications", ACS Photonics, 2017, pp. 2556-2565, vol. 4, DOI: 10.1021/ acsphotonics.7b00852.

* cited by examiner

Beugungswinkel / °2θ

Beugungswinkel / °2θ

RED LUMINESCENT MATERIAL AND CONVERSION LED

CROSS-REFERENCE TO RELATED APPLICATIONS

The present application is a national stage entry according to 35 U.S.C. § 371 of PCT application No.: PCT/EP2021/059855 filed on Apr. 16, 2021; which claims priority to German patent application DE 10 2020 205 103.8, filed on Apr. 22, 2020; all of which are incorporated herein by reference in their entirety and for all purposes.

TECHNICAL FIELD

The disclosure relates to a luminophore and to a conversion LED especially comprising the luminophore.

BACKGROUND

In white light-emitting conversion LEDs as used in general lighting, the red component of the white overall radiation is produced by the conversion of short-wave, in particular blue, primary light from a semiconductor layer sequence to longer-wave, red radiation by means of an inorganic luminophore. A crucial role is played here by the shape and position of the emission band in the red spectral region. The human eye is fundamentally less sensitive to red radiation than to green radiation, for example. The lower the energy or the greater the wavelength in the wavelength range above 555 nm, the poorer/less efficient the ability to perceive red radiation in particular. In a white light-emitting conversion LED, however, the red spectral regions, especially deep red spectral regions having long wavelengths are particularly important when the conversion LED is to have a high color rendering index (CRI) in combination with high luminous efficacy of radiation (LER) and low correlated color temperature (CCT). Typical red luminophores for these applications are based on $Eu^{2+}$, and these elements are introduced into organic host structures in which they then cause longer-wave emissions under absorption of short-wave, in particular blue, light. These luminophores generally have broad emission spectra or emission bands. Accordingly, in the case of red-emitting luminophores, many photons are inevitably also converted to those spectral regions (large wavelengths; e.g. >650 nm) that can be perceived only very inefficiently by the human eye. This leads to a significant reduction in efficiency of the conversion LED in relation to eye sensitivity. In order to solve this problem, it is possible to attempt a short-wave shift in the emission spectrum by variations in the chemical composition of the host structure, i.e. to increase the integral overlap with the eye sensitivity curve. As a result of the Gaussian distribution of the photons emitted, however, this also leads to a reduction in the photon count in the desired red spectral region, and the abovementioned criteria can accordingly no longer be fulfilled.

Luminophores such as nitridolithoaluminate "$SrLiAl_3N_4$: $Eu^{2+}$" (WO 2013/175336 A1; Narrow-band red-emitting $Sr[LiAl_3N_4]:Eu^{2+}$ as a next-generation LED-phosphor material, Nature Materials 2014; P. Pust et al.) already have extremely narrow emission bands with FWHM <55 nm, which leads to a reduction in those converted photons in the long-wave region of the visible spectrum (long-wave flank of the emission band) that are perceived very inefficiently by the human eye. At the same time, however, the emission maximum of $SrLiAl_3N_4:Eu^{2+}$ at about 650 nm is so far into the deep-red region that conversion LEDs comprising this luminophore as the only red component have barely any efficiency advantage, if any, over solutions comprising broader-band luminophores. The efficiency losses here are dominant over the CRI gain (R9). Another luminophore, $SrMg_3SiN_4:Eu^{2+}$ (Toward New Phosphors for Application in Illumination-Grade White pc-LEDs: The Nitridomagnesosilicates $Ca[Mg_3SiN_4]:Ce^{3+}$, $Sr[Mg_3SiN_4]:Eu^{2+}$ and $Eu[Mg_3SiN_4]$, Chemistry of Materials 2014, S. Schmiechen et al.), shows a blue-shifted, likewise extremely narrow emission band (FWHM <45 nm) that has its emission maximum at about 615 nm and hence within an ideal range for red luminophores. Disadvantageously, this compound shows significant thermal quenching, such that it is barely possible to observe any emission even at room temperature. Employment in conversion LEDs is thus impossible.

There is thus a great need for red-emitting luminophores having a minimum spectral width of emission ("full width at half maximum", FWHM) in order to keep the number of photons small in spectral regions of low eye sensitivity and simultaneously to emit many photons in the desired red spectral region.

It is an objective to specify a luminophore that emits radiation in the red spectral region and has a small spectral emission width (full width at half maximum). It is a further objective to specify a conversion LED comprising the luminophore described here.

SUMMARY

A luminophore is specified, especially a red-emitting luminophore.

In at least one embodiment, the luminophore comprises a phase having the empirical formula $A_{1-y}A'_yLiXF_6:Mn^{4+}$, wherein A=Na, K, Rb and/or Cs;

A'=Na, K, Rb, Li and/or Cs;

X=Si, Ti, Hf, Zr, Sn, Pb and/or Ge;

$0≤y<1$ and

A and A' are different. The luminophore may consist of $A_{1-y}A'_yLiXF_6:Mn^{4+}$. In other words the luminophore may have the empirical formula $A_{1-y}A'_yLiXF_6:Mn^{4+}$. $Mn^{4+}$ especially replaces $X^{4+}$.

Luminophores are described here and hereinbelow in terms of empirical formulae. In the empirical formulae specified, it is possible that the luminophore comprises further elements, for instance in the form of impurities, where these impurities taken together have a maximum proportion of 3 mol % or 5 mol %.

In at least one embodiment the luminophore comprises a phase having the empirical formula $A_{1-y}A'_yLiXF_6:Mn^{4+}$, wherein A=Na, K, Rb and/or Cs;

A'=Na, K, Rb, Li and/or Cs;

X=Si alone or in combination with Ti, Hf, Zr, Sn, Pb and/or Ge;

$0≤y<1$ and

A and A' are different. The luminophore may consist of $A_{1-y}A'_yLiXF_6:Mn^{4+}$. In other words the luminophore may have the empirical formula $A_{1-y}A'_yLiXF_6:Mn^{4+}$. $Mn^{4+}$ especially replaces $X^{4+}$.

In at least one embodiment the luminophore comprises a phase having the empirical formula $A_{1-y}A'_yLiSiF_6:Mn^{4+}$, wherein A=Na, K, Rb and/or Cs;

A'=Na, K, Rb, Li and/or Cs;

$0≤y<1$ and

A and A' are different. The luminophore may consist of $A_{1-y}A'_yLiSiF_6:Mn^{4+}$. In other words the luminophore may have the empirical formula $A_{1-y}A'_yLiSiF_6:Mn^{4+}$. $Mn^{4+}$ especially replaces $Si^{4+}$.

In at least one embodiment the luminophore comprises a phase having the empirical formula $ALiXF_6:Mn^{4+}$, wherein A=Na, K, Rb and/or Cs and X=Si, Ti, Hf, Zr, Sn, Pb and/or Ge. The luminophore may consist of $ALiXF_6:Mn^{4+}$. In other words the luminophore may have the empirical formula $ALiXF_6:Mn^{4+}$. $Mn^{4+}$ especially replaces $X^{4+}$. In at least one embodiment the luminophore comprises a phase having the empirical formula $ALiXF_6:Mn^{4+}$, wherein A=Na, K, Rb and/or Cs and X=Si alone or in combination with Ti, Hf, Zr, Sn, Pb and/or Ge. The luminophore may consist of $ALiXF_6:Mn^{4+}$. In other words the luminophore may have the empirical formula $ALiXF_6:Mn^{4+}$. $Mn^{4+}$ especially replaces $X^{4+}$.

In at least one embodiment the luminophore comprises a phase having the empirical formula $ALiSiF_6:Mn^{4+}$, wherein A=Na, K, Rb and/or Cs. The luminophore may consist of $ALiSiF_6:Mn^{4+}$. In other words the luminophore may have the empirical formula $ALiSiF_6:Mn^{4+}$. $Mn^{4+}$ especially replaces $Si^{4+}$.

In at least one embodiment the luminophore has the empirical formula $ALiSi_{1-x}Mn_xF_6$, wherein $0.001 \leq x \leq 0.1$, such as $0.005 \leq x \leq 0.08$, or $0.01 \leq x \leq 0.06$.

In at least one embodiment the luminophore comprises a phase having the empirical formula $ALiSiF_6:Mn^{4+}$ or $ALiSi_{1-x}Mn_xF_6$, wherein A=K and/or Cs. The luminophore may consist of $ALiSiF_6:Mn^{4+}$ or $ALiSi_{1-x}Mn_xF_6$, where A=K and/or Cs.

In at least one embodiment the luminophore comprises a phase having the empirical formula $CsLiSiF_6:Mn^{4+}$ or $CsLiSi_{1-x}Mn_xF_6$. The luminophore may consist of $CsLiSiF_6:Mn^{4+}$ or $CsLiSi_{1-x}Mn_xF_6$.

In at least one embodiment the luminophore comprises a phase having the empirical formula $KLiSiF_6:Mn^{4+}$ or $KLiSi_{1-x}Mn_xF_6$. The luminophore may consist of $KLiSiF_6:Mn^{4+}$ or $KLiSi_{1-x}Mn_xF_6$.

The luminophore is an $Mn^{4+}$-doped hexafluorosilicate. A known luminophore from this material class is $K_2SiF_6:Mn^{4+}$. The emission spectrum of this luminophore features narrow emission bands, where the full width at half maximum of these emission bands is below 10 nm and hence much smaller than corresponding emission bands, for example for $Eu^{2+}$-doped luminophores. $K_2SiF_6:Mn^{4+}$ is prepared by a precipitation reaction in aqueous hydrofluoric acid (HF) (Efficient Mn (IV) Emission in Fluorine Coordination, A. G. Paulusz, J. Electrochem. Soc.: Solid-State Science and Technology 1973, 942). Reactants used are, for example, $K_2CO_3$ or KF (which also forms through dissolution of $K_2CO_3$ in HF), and $SiO_2$ and a manganese source.

As has already been demonstrated for the luminophore $Li_2SiF_6:Mn^{4+}$ (DE 10 2018 218 159.4) the synthesis for $K_2SiF_6:Mn^{4+}$ does not appear to be transferrable to the preparation of Li-containing hexafluorosilicates. In other words, the luminophore $ALiSi_{1-x}Mn_xF_6$, in particular $KLiSiF_6:Mn^{4+}$ and $CsLiSiF_6:Mn^{4+}$, does not form from a precipitation reaction in aqueous hydrofluoric acid (HF), especially using the reactants $Li_2CO_3$, $A_2CO_3$ $SiO_2$ and a manganese source. Since $Li_2CO_3$ and LiF formed therefrom in hydrofluoric acid have much poorer solubility in aqueous HF than $K_2CO_3$ and KF, the free Mn' ion cannot be stabilized in the solution since effectively no free Li IMs for complexing are present.

To the inventors' knowledge, there are no known publications to date that disclose a successful synthesis and specific working examples of $ALiSi_{1-x}Mn_xF_6$, in particular $KLiSiF_6:Mn^{4+}$. The inventors have surprisingly succeeded in synthesizing the luminophores of formula $ALiSiF_6:Mn^{4+}$ for the first time and in detailing an implementable route to the synthesis thereof.

It has been found that $KLiSiF_6:Mn^{4+}$ on excitation with primary radiation has an emission or secondary radiation with a peak wavelength in the red spectral region. The peak wavelength is especially about 631 nm. With a surprisingly short-wave emission maximum of about 631 nm, the emission is advantageously within a preferred region for red luminophores. The position of the emission maximum and the simultaneously small full width at half maximum of the emission bands advantageously results in emission of many photons in the desired visible red spectral region, and minimization of the converted photons in the long-wave red region of the visible spectrum that are perceived very inefficiently by the human eye. The luminophore is thus of excellent suitability for a conversion LED that emits white overall radiation, since it is possible to achieve a high color rendering index and a high luminous efficacy of radiation (LER) of the overall radiation.

It has additionally been found that, surprisingly, the luminous efficacy of radiation (LER) of $KLiSiF_6:Mn^{4+}$ is higher than for $K_2SiF_6:Mn^{4+}$.

The "peak wavelength" or "emission maximum" refers in the present context to the wavelength in the emission spectrum of a luminophore at which the maximum intensity in the emission spectrum lies.

In at least one embodiment, the luminophore crystallizes in an orthorhombic crystal system. In particular, the luminophore crystallizes in the space group Pbcn (no. 60). The lattice parameters are in particular a=747.50(3) pm, b=1158.58(5) pm and c=979.77(4) pm.

In at least one embodiment, the crystal structure comprises $LiF_6$ and $XF_6$ octahedra, which are bonded, in particular vertice- and edge-bonded, to one another via common F atoms.

The term "octahedron" is used here and hereinbelow to describe the bonding pattern and coordination sphere of the individual atoms within the crystal structure. However, here and hereinbelow the term "octahedron" is not to be understood exclusively in the strictly mathematical sense. In particular, slight distortions may occur so that the bond distances and angles can differ from those of a perfect octahedron in the mathematical sense. Individual atom positions may especially also exhibit a shift or displacement relative to the positions of a perfect octahedral coordination. This especially includes 5+1 or 4+2 coordinations.

In at least one embodiment, the crystal structure comprises $LiF_6$ and $SiF_6$ octahedra which are bonded, in particular vertice- and edge-bonded, to one another via common F atoms.

By contrast, the known luminophore $Li_2SiF_6:Mn$ (LSF) crystallizes in the trigonal space group P321 (no. 150) and the known luminophore $K_2SiF_6:Mn$ (KSF) in the cubic space group Fm-3m (no. 225). While the empirical formula of the luminophore $KLiSiF_6:Mn$ may be formally described as consisting of equal parts of the known phases $Li_2SiF_6:Mn$ (LSF) and $K_2SiF_6:Mn$ (KSF) the luminophore surprisingly crystallizes in the space group Pbcn (no. 60) contrary to literature predictions (J. A. Skarulis, J. B. Seibert, *J. Chem. Eng. Data* 1970, 15, 37-43).

In a further embodiment, $Mn^{4+}$ may be present in molar percentages between 0.1 mol % to 10 mol %, 0.5 mol % to 8 mol % or 1 mol % to 6 mol %. Here and hereinbelow reported molar percentages for $Mn^{4+}$ are to be understood as based on the mole fractions of Si in the luminophore.

In at least one embodiment, the luminophore is capable of absorbing primary radiation from the UV to blue spectral region and converting it into secondary radiation in the red spectral region.

In at least one embodiment, the luminophore, in particular $KLiSiF_6$:Mn, has a full width at half maximum of the emission bands of below 10 nm. In particular, the full width at half maximum of the emission bands of maximum intensity (emission maximum, peak wavelength) is below 15 nm.

The full width at half maximum (FWHM) is here and hereinbelow to be understood as meaning the spectral width at half the height of the maximum of an emission peak or of an emission band or emission line.

Upon excitation with a primary radiation from the UV to blue spectral region the luminophore $KLiSiF_6$:$Mn^{4+}$ emits a secondary radiation having a peak wavelength in the red spectral region at about 631 nm. The emission bands of the luminophore especially have a full width at half maximum below 10 nm and this ultimately results in a higher luminous efficacy of radiation (LER) as a result of a large overlap with the human eye sensitivity curve having a maximum at 555 nm. This makes it possible to provide particularly efficient conversion LEDs with the luminophore.

The inventors have thus recognized that it is possible to provide a novel luminophore having advantageous properties that could not be provided to date.

A process for preparing a luminophore is specified. All definitions and embodiments of the luminophore are also applicable to the process for preparation thereof, and vice versa.

In at least one embodiment, the luminophore having the empirical formula $ALiSiF_6$:$Mn^{4+}$ is prepared by a solid-state synthesis. The inventors have found that the luminophore surprisingly cannot be prepared by a wet-chemical precipitation reaction from HF.

In at least one embodiment, no aqueous HF is employed in the solid-state synthesis. Aqueous HF is in particular to be understood as meaning a solution of HF in water.

In at least one embodiment, the solid-state synthesis is performed at elevated pressure and elevated temperature. Elevated pressure is to be understood as meaning a pressure above 1 bar, and elevated temperature a temperature above 25° C.

In at least one embodiment, the solid-state synthesis is performed at a pressure of 25 kbar to 85 kbar and in a temperature range between 500° C. and 1000° C.

In at least one embodiment, the reactants employed in the solid-state synthesis of the luminophore $A_{1-y}A'_yLiXF_6$:$Mn^{4+}$ are $A_2XF_6$, where A=Na, K, Rb or Cs, $A'_2XF_6$, where A'=Na, K, Rb, Li or Cs, $Li_2XF_6$ and $X'_2MnF_6$, where X'=Li, Na, K, Rb or Cs, or $A_{1-y}A'_yLiXF_6$, where A=Na, K, Rb or Cs, A'=Na, K, Rb, Li or Cs and 0≤y<1, and $X'_2MnF_6$, where X'=Li, Na, K, Rb or Cs.

In at least one embodiment, the reactants employed in the solid-state synthesis of the luminophore $A_{1-y}A'_yLiSiF_6$:$Mn^{4+}$ are $A_2SiF_6$, where A=Na, K, Rb or Cs, $A'_2SiF_6$, where A'=Na, K, Rb, Li or Cs, $Li_2SiF_6$ and $X'_2MnF_6$, where X'=Li, Na, K, Rb or Cs, or $A_{1-y}A'_yLiSiF_6$, where A=Na, K, Rb or Cs, A'=Na, K, Rb, Li or Cs and 0≤y<1, and $X'_2MnF_6$, where X'=Li, Na, K, Rb or Cs.

In at least one embodiment, the reactants employed in the solid-state synthesis are $A_2SiF_6$, where A=Na, K, Rb or Cs, $Li_2SiF_6$ and $X'_2MnF_6$, where X=Li, Na, K, Rb or Cs, or $ALiSiF_6$, where A=Na, K, Rb or Cs, and $X'_2MnF_6$, where X'=Li, Na, K, Rb or Cs. The reactants employed in the solid-state synthesis may be $Li_2SiF_6$, $K_2SiF_6$ and $K_2MnF_6$ or $KLiSiF_6$ and $K_2MnF_6$.

In at least one embodiment, the synthesis of $A_{1-y}A'_yLiXF_6$:Mn comprises milling $A_{1-y}A'_yLiXF_6$ with $X'_2MnF_6$ in a ball mill. The milling in the ball mill dopes $A_{1-y}A'_yLiXF_6$ with Mn.

In at least one embodiment, the synthesis of $A_{1-y}A'_yLiSiF_6$:Mn comprises milling $A_{1-y}A'_yLiSiF_6$ with $X'_2MnF_6$ in a ball mill. The milling in the ball mill dopes $A_{1-y}A'_yLiSiF_6$ with Mn.

In at least one embodiment, the synthesis of $ALiXF_6$:Mn comprises milling $ALiXF_6$ with $X'_2MnF_6$ in a ball mill. The milling in the ball mill dopes $ALiXF_6$ with Mn.

In at least one embodiment, the synthesis of $ALiSiF_6$:Mn comprises milling $ALiSiF_6$, such as $KLiSiF_6$, with $X'_2MnF_6$ in a ball mill. The milling in the ball mill dopes $ALiSiF_6$, such as $KLiSiF_6$, with Mn.

In at least one embodiment, the synthesis of $A_{1-y}A'_yLiSiF_6$:Mn is carried out in two stages, wherein in a first step $A_2SiF_6$, where A=Na, K, Rb or Cs and A'=Na, K, Rb, Li or Cs, and $Li_2SiF_6$ are mixed, calcined and cooled to prepare $A_{1-y}A'_yLiSiF_6$ and in a second step $A_{1-y}A'_yLiSiF_6$ is milled in a ball mill with $X'_2MnF_6$ to prepare $A_{1-y}A'_yLiSiF_6$:Mn. The molar ratio of $A_2SiF_6$ and $A'_2SiF_6$ to $Li_2SiF_6$ is especially 1:1.

In at least one embodiment, a molar ratio of the molar amount of $A_{1-y}A'_yLiSiF_6$ to the molar amount of $X'_2MnF_6$ is between 1.000 to 0.200 and 1.000 to 0.001, for example 1 to 0.043.

In at least one embodiment, the synthesis of $ALiSiF_6$:Mn is carried out in two stages, wherein in a first step $A_2SiF_6$, where A=Na, K, Rb or Cs, and $Li_2SiF_6$ are mixed, calcined and cooled in a molar ratio of 1:1 to prepare $ALiSiF_6$ and in a second step $ALiSiF_6$ is milled in a ball mill with $X'_2MnF_6$ to prepare $ALiSiF_6$:Mn.

In at least one embodiment, a molar ratio of the molar amount of $ALiSiF_6$ to the molar amount of $X'_2MnF_6$ is between 1.000 to 0.200 and 1.000 to 0.001, for example 1 to 0.043.

In at least one embodiment, a molar ratio of the molar amount of $KLiSiF_6$ to the molar 5 amount of $K_2MnF_6$ is between 1.000 to 0.200 and 1.000 to 0.001, for example 1 to 0.043.

A conversion LED may include the luminophore. All details and definitions relating to the luminophore and to the process for preparing the luminophore are also applicable to the conversion LED, and vice versa.

In at least one embodiment, the conversion LED comprises a semiconductor layer sequence. The semiconductor layer sequence is adapted to emit electromagnetic primary radiation.

In at least one embodiment, the semiconductor layer sequence comprises at least one III-V compound semiconductor material. The semiconductor material is, for example, a nitride compound semiconductor material, such as $Al_n In_{1-n-m}Ga_mN$ where, in each case, 0≤n≤1, 0≤m≤1 and n+m≤1. The semiconductor layer sequence may comprise dopants and additional constituents. For the sake of simplicity, however, only the essential constituents of the semiconductor layer sequence, i.e. Al, Ga, In and N, are specified, even though these may be replaced and/or supplemented to some degree by small amounts of further substances. The semiconductor layer sequence is especially formed from InGaN.

The semiconductor layer sequence comprises an active layer having at least one pn junction and/or having one or more quantum well structures. In the operation of the conversion LED, electromagnetic radiation is produced in the active layer. A wavelength or the emission maximum of the radiation may be in the ultraviolet and/or visible region, especially at wavelengths between 300 nm and 470 nm inclusive.

The conversion LED may be adapted to emit white or colored light.

In combination with the luminophore present in the conversion LED, the conversion LED may be adapted to emit red light in full conversion or white light in partial or full conversion. Such conversion LEDs are especially suitable for applications where a high color rendering index (e.g. R9) is required, as in general lighting or background lighting, for example of displays suitable for representation of large color spaces.

The conversion LED comprises a conversion element. In particular, the conversion element comprises the lumino-phore or consists of the luminophore. The luminophore at least partly or fully converts the electromagnetic primary radiation to electromagnetic secondary radiation in the red spectral region.

In at least one embodiment, the conversion element or conversion LED comprises no further luminophore in addition to the luminophore. The conversion element may also consist of the luminophore. The luminophore may be adapted to fully convert the primary radiation. In this embodiment the overall radiation from the conversion LED is in the red region of the electromagnetic spectrum.

In at least one embodiment, the conversion element or conversion LED comprises a further red-emitting lumino-phore in addition to the luminophore. The conversion element may also consist of the luminophore and the further red-emitting luminophore. The luminophores may be adapted to fully convert the primary radiation. In this embodiment the overall radiation from the conversion LED is in the red region of the electromagnetic spectrum. For example, the further red-emitting luminophore may have the formula $Sr[Al_2Li_2O_2N_2]$:Eu. $Sr[Al_2Li_2O_2N_2]$:Eu may crystallize in the tetragonal $P4_2/m$ space group. The further luminophore advantageously allows the color locus of the overall radiation to be adapted as required. This additionally makes it possible to achieve particularly high color saturation and efficiency that typically cannot be achieved by the use of just one luminophore.

In at least one embodiment, the conversion element comprises a second and/or third luminophore in addition to the luminophore. The conversion element may comprise further luminophores in addition to the luminophore, the second luminophore and the third luminophore. The luminophores are embedded in a matrix material for example. Alternatively, the luminophores may also be in a converter ceramic.

The conversion LED may comprise a second luminophore for emission of radiation from the green spectral region.

Alternatively or in addition, the conversion LED may comprise a third luminophore. The third luminophore may be adapted for emission of radiation from the yellow spectral region. In other words, the conversion LED may then comprise at least three luminophores: a yellow-emitting luminophore, a green-emitting luminophore and the red-emitting luminophore. The conversion LED is adapted for full conversion or partial conversion, where the primary radiation in the case of full conversion may be selected from the UV to blue spectral region and in the case of partial conversion from the blue region. The resulting overall radiation from the conversion LED is then especially white mixed radiation.

Alternatively or in addition, the conversion LED may comprise a fourth luminophore. The fourth luminophore may be adapted for emission of radiation from the blue spectral region. The conversion LED may then comprise at least three luminophores: a blue-emitting luminophore, a green-emitting luminophore and the red-emitting lumino-phore. The conversion LED may then comprise at least four luminophores: a blue-emitting luminophore, a green-emit-ting luminophore, a yellow-emitting luminophore and the red-emitting luminophore. The conversion LED is adapted for full conversion, where the primary radiation in the case of full conversion may be selected from the UV spectral region. The resulting overall radiation from the conversion LED is then especially white mixed radiation.

Yellow, blue and green luminophores are known to the person skilled in the art and are not detailed separately here.

Luminophores present in addition to the luminophore may especially increase the color rendering index. Further luminophores in addition to the second, third and/or fourth luminophore are especially not ruled out. The higher the color rendering index, the more true, or true to nature, the color impression perceived.

WORKING EXAMPLE $KLiSiF_6$ was prepared by means of solid-state synthesis in a multi-anvil high-pressure press at a pressure of 5.5 GPa (55 kbar) and high temperatures. The reactants employed were $Li_2SiF_6$ and $K_2SiF_6$ in a molar ratio of 1 to 1. The pressure of 55 kbar was built up over 145 minutes. The temperature was increased at a heating rate of 75° C. per minute to 750° C. and the temperature of 750° C. was maintained for 150 minutes. Thereafter, the temperature was cooled to 350° C. at a cooling rate of 2.22° C. per minute and the product $KLiSiF_6$ was subsequently quenched to room temperature (25° C.). The pressure was subsequently relieved over 430 minutes.

The obtained $KLiSiF_6$ was then milled in a ball mill with $K_2MnF_6$ to effect doping of $KLiSiF_6$ with Mn and prepare the inventive luminophore $KLiSiF_6$:$Mn^{4+}$. This comprises milling the sample with the reagent $K_2MnF_6$ for 10 minutes at 300 rpm six times. A pause of 15 minutes is maintained between the milling steps. Analysis by x-ray powder meth-ods shows that the luminophore can be prepared in good quality (FIGS. 3A and 3B).

BRIEF DESCRIPTION OF THE DRAWINGS

Further advantageous embodiments and developments are apparent from the working examples described hereinbelow with reference to the figures.

DETAILED DESCRIPTION

Figure 1A:
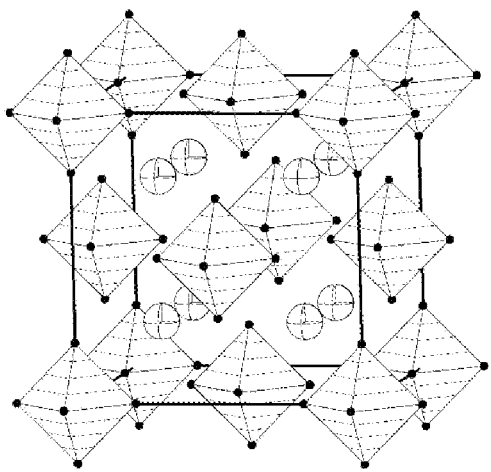
FIG. 1A shows the unit cell of cubic $K_2SiF_6$ (space group no. 225; Fm-3m).

FIG. 1A shows the unit cell of the crystal structure of $K_2SiF_6$, which crystallizes in the cubic space group Fm-3m. The K atoms are shown as unfilled circles, the F atoms as filled circles, and $[SiF_6]^{2-}$ octahedra with Si in the center and F at the vertices with hatching. In the luminophore $K_2SiF_6$:$Mn^{4+}$ Si has been partly replaced by Mn (not shown, no measurable effect on crystal structure). $K_2SiF_6$ (with or without $Mn^{4+}$) crystallizes in the $K_2PtCl_6$ type in the space group Fm-3m (no. 225). The unit cell shows a cubic metric with a lattice parameter a=8.134(1) Å.

Figure 1B:
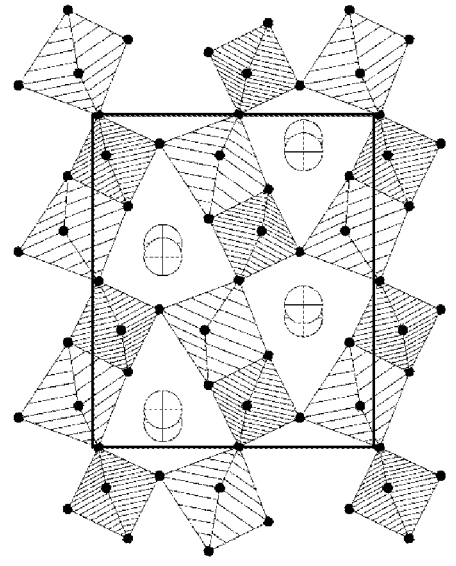
FIG. 1B shows the unit cell of cubic $KLiSiF_6$.

FIG. 1B shows the unit cell of the crystal structure of $KLiSiF_6$. The K atoms are shown as unfilled circles, the F atoms as filled circles, $[SiF_6]^{2-}$ octahedra with Si in the center and F at the vertices with fine hatching and $[LiF_6]^{5-}$ octahedra with Li in the center and F at the vertices with coarse hatching. In the luminophore $KLiSiF_6$:$Mn^{4+}$ Si has been partly replaced by Mn (not shown, no measurable effect on crystal structure) and so $Mn^{4+}$ is octahedrally surrounded by F atoms. Compared to $K_2SiF_6$ (with or without $Mn^{4+}$), $KLiSiF_6$ (with or without $Mn^{4+}$) surprisingly crystallizes in the space group Pbcn (no. 60) and the unit cell shows an orthorhombic metric with lattice parameters a=747.50(3) pm, b=1158.58(5) pm and c=979.77(4) pm. The crystal structure, the units and the bonding patterns thereof are similar to what is observed in $(NH_4)MnFeF_6$.

The crystallographic data are shown in table 1.

TABLE 1

| Empirical formula | KLiSiF6 |
| --- | --- |
| Crystal system | orthorhombic |
| Space group | Pbcn (no. 60) |
| a/pm | 747.50(3) |
| b/pm | 1158.58(5) |
| c/pm | 979.77(4) |
| Cell volume/nm³ | 0.8485(1) |
| Z | 8 |
| Density/g × cm⁻³ | 2.945 |
| T/K | 203(2) |
| Diffractometer | BRUKER D8 Quest |
| Radiation/Å | Mo-Kα (λ = 0.71073) |
| Measured range/° | 6.5 < 2θ < 75.8 |
|  | −12 < h < 12 |
|  | −19 < k < 19 |
|  | −16 < l < 16 |
| R₁/wR₂ [I ≥ 2σ(I)] | 0.0188/0.0420 |
| R₁/wR₂ [all data] | 0.0255/0.0438 |
| GooF | 1.080 |

Comparison of the FIGS. 1A and 1B clearly shows that the crystal structures appreciably differ from one another. Cubic $K_2SiF_6$ for example comprises only $[SiF6]^{2-}$ octahedra, which are spatially separate from one another, while $KLiSiF_6$ comprises two different units, $[SiF6]^{2-}$ and $[LiF6]^{5-}$ octahedra, which are additionally bonded to one another. The same differences are thus also present in the crystal structures of $K_2SiF_6$:$Mn^{4+}$ and $KLiSiF_6$:$Mn^{4+}$.

Figure 2:
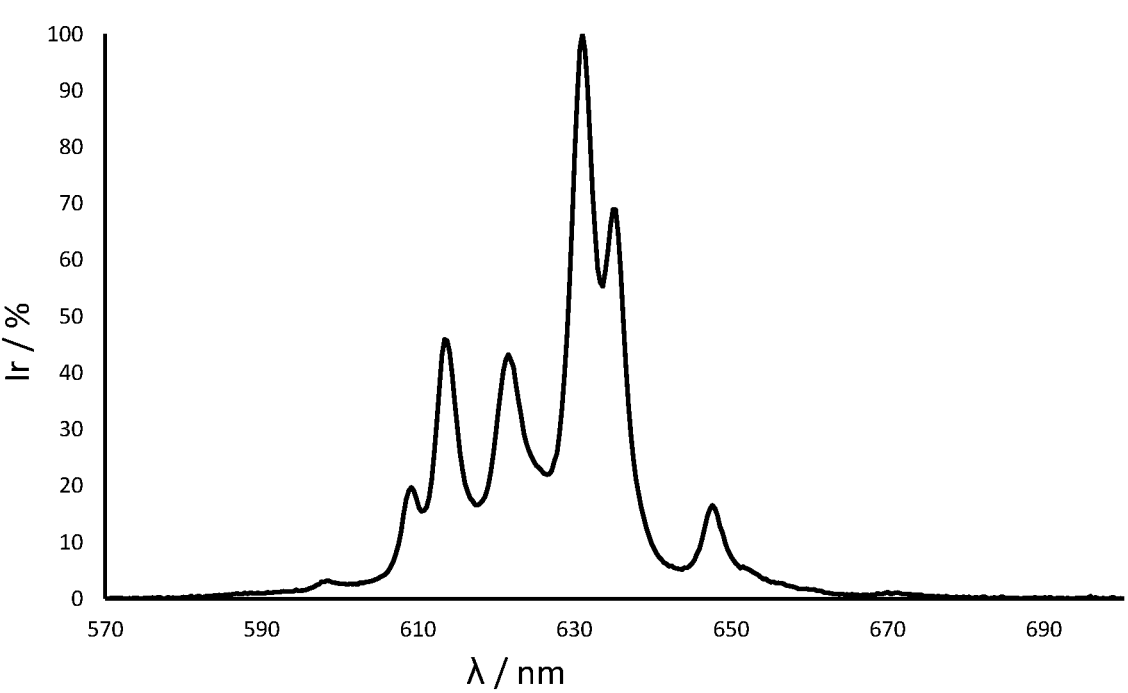
FIG. 2 shows an emission spectrum of the inventive luminophore $KLiSiF_6$:$Mn^{4+}$.

FIG. 2 shows the emission spectrum of a single-crystal of the inventive luminophore $KLiSiF_6$:$Mn^{4+}$ upon excitation with blue laser light ($\lambda_{exc}$=448 nm). Excitation with blue laser light causes $KLiSiF_6$:$Mn^{4+}$ to show (deep) red luminescence with a typical line spectrum for $Mn^{4+}$-doped luminophores. An emission maximum of ≈631 nm means that the emission is also in a preferred range for red luminophores.

Since the electronic transitions for $Mn^{4+}$ (d-d transitions) occur in inner, shielded electron shells, the position of the emission bands is not strongly dependent on the environment of the activator in the crystal structure as is the case for $Eu^{2+}$-based luminophores. Red emission thus typically results when $Mn^{4+}$ is surrounded by six F atoms (in the shape of an octahedron) in the structure (for example replacement of $Si^{4+}$ by $Mn^{4+}$). However, slight variations in emission are achievable for example by altering the coordination number (CN) of the counterions in the structure. Compounds having night counterions emit at shorter wavelength than their variants with identical molar composition but heavier counterions (Highly Efficient and Stable Narrow-Band Red Phosphor $Cs_2SiF_6$:$Mn^{4+}$ for High-Power Warm White LED Applications, ACS Photonics 2017, E. Song et al.). $Cs_2SiF_6$:Mn (CsSF:Mn) for example shows an emission maximum at higher wavelengths ($\lambda_{max}$=632 nm). This red shift simultaneously causes reduced efficiency and is therefore undesired for most applications.

Figure 3A:
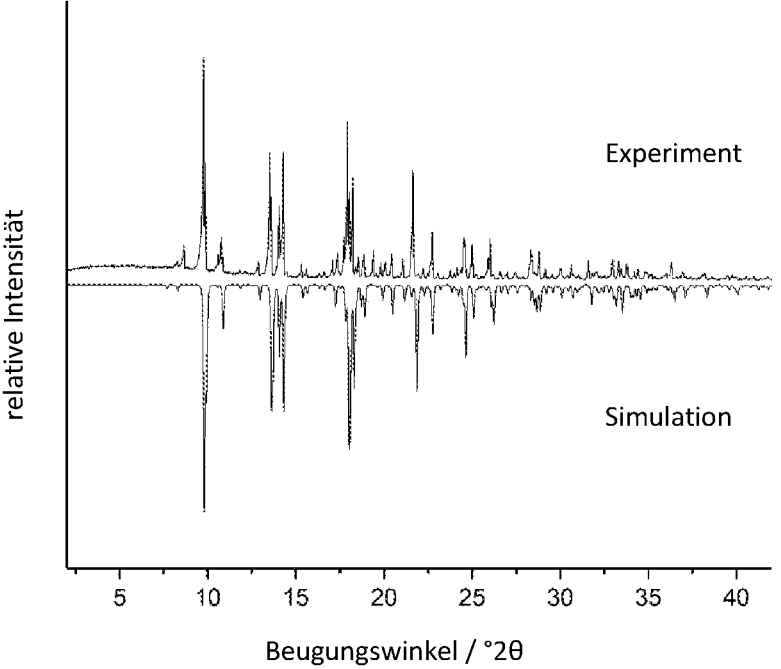
FIG. 3A shows a PXRD comparison (Mo—$K\alpha_1$ radia-tion) of $KLiSiF_6$ with a simulation of $KLiSiF_6$ based on single-crystal data.

FIG. 3A shows a comparison of powder x-ray diffraction (PXRD) diffractograms (Mo—$K\alpha_1$ radiation). Shown here is the measured x-ray diffraction diffractogram of the undoped precursor $KLiSiF_6$ of the inventive luminophore $KLiSiF_6$:$Mn^{4+}$ compared to a simulation of $KLiSiF_6$ based on single-crystal data (see table 1). Good agreement is apparent and these analyses by x-ray powder methods therefore show that $KLiSiF_6$ was prepared in good quality.

Figure 3B:
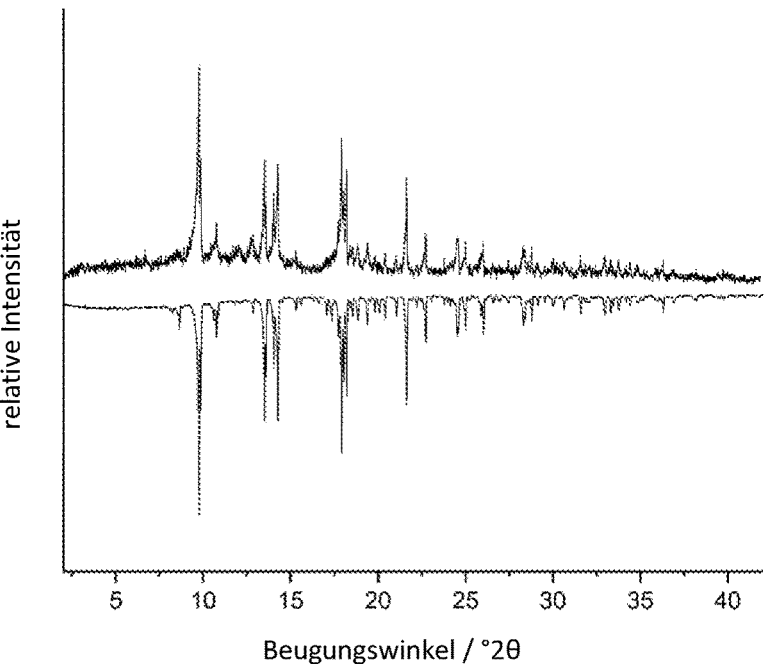
FIG. 3B shows a PXRD comparison (Mo—$K\alpha_1$ radia-tion) of $KLiSiF_6$:$Mn^{4+}$ with $KLiSiF_6$.

FIG. 3B shows a comparison of x-ray diffraction (PXRD) diffractograms (Mo—$K\alpha_1$ radiation). Shown here are the measured x-ray diffraction diffractograms of the inventive luminophore $KLiSiF_6$:$Mn^{4+}$ (top) compared to the measured x-ray diffraction diffractograms of the reactant $KLiSiF_6$ before ball-milling (bottom). Due to the small amounts of $Mn^{4+}$ no difference between undoped and doped form is visible in PXRD. Good agreement is apparent and shows that the crystal structure remains unchanged even after ball-milling of $KLiSiF_6$ with $K_2MnF_6$. It can be concluded from FIGS. 3A and 3B that the inventive luminophore can be prepared in good quality.

Figure 3C:
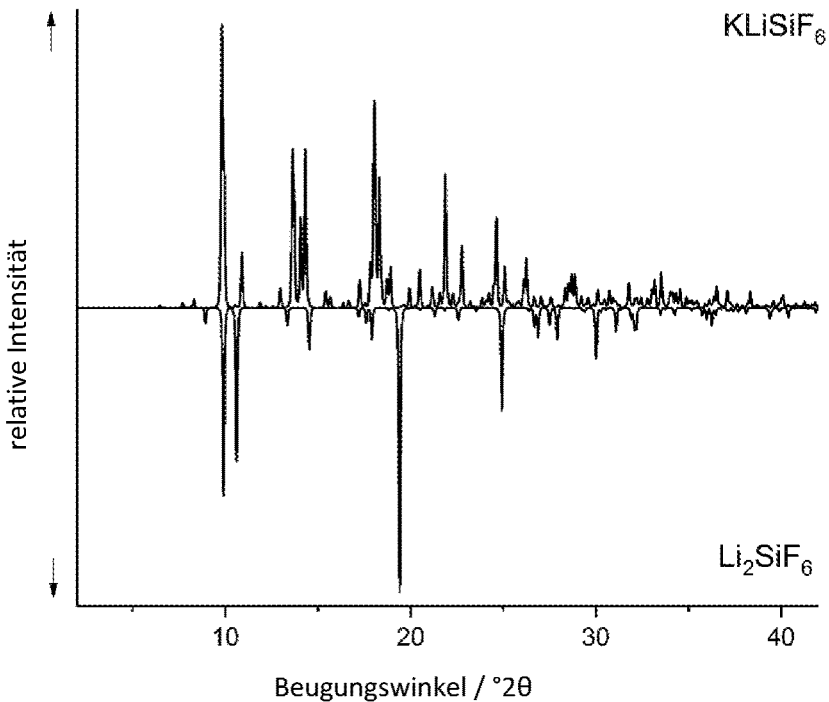
FIG. 3C shows a comparison of PXRD simulations (Mo—$K\alpha_1$ radiation) of $KLiSiF_6$ and $Li_2SiF_6$ based on single-crystal data.

FIG. 3C shows a comparison of x-ray diffraction (PXRD) diffractograms (Mo—$K\alpha_1$ radiation). Shown here is an x-ray diffraction diffractogram of $KLiSiF_6$ simulated from single-crystal data compared to an x-ray diffraction diffractogram of $Li_2SiF_6$ simulated from single-crystal data.

Figure 3D:
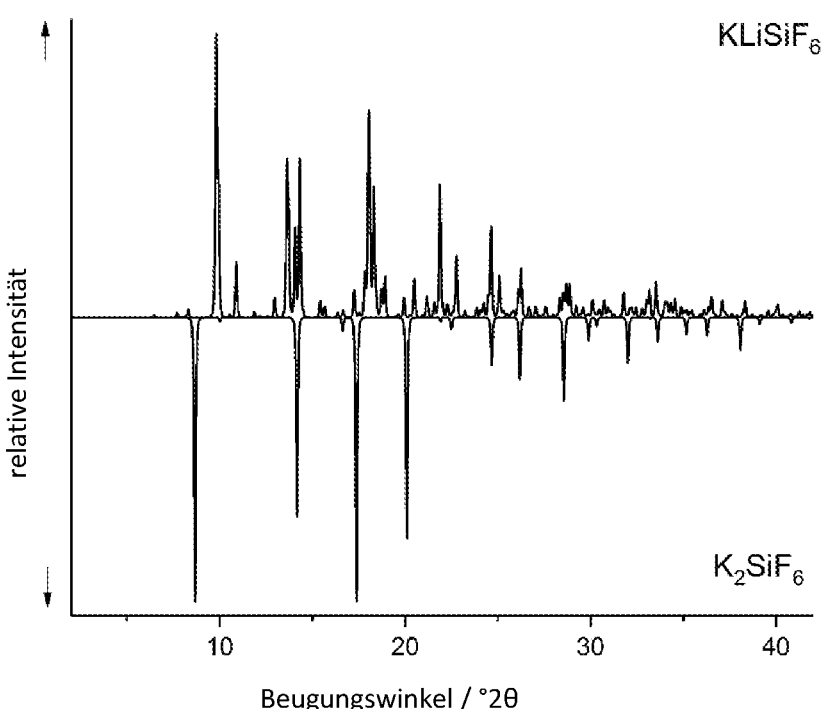
FIG. 3D shows a comparison of PXRD simulations (Mo—$K\alpha_1$ radiation) of $KLiSiF_6$ and $K_2SiF_6$ based on single-crystal data.

FIG. 3D shows a comparison of x-ray diffraction (PXRD) diffractograms (Mo—$K\alpha_1$ radiation). Shown here is an x-ray diffraction diffractogram of $KLiSiF_6$ simulated from single-crystal data compared to an x-ray diffraction diffractogram of $K_2SiF_6$ simulated from single-crystal data.

As is apparent from FIGS. 3C and 3D the x-ray powder diffractogram of $KLiSiF_6$ differs markedly from those of $Li_2SiF_6$ and $K_2SiF_6$ and accordingly the x-ray powder diffractogram of the inventive luminophore $KLiSiF_6$:$Mn^{4+}$ also differs markedly from those of $K_2SiF_6$:$Mn^{4+}$ and $Li_2SiF_6$:$Mn^{4+}$.

Figure 4:
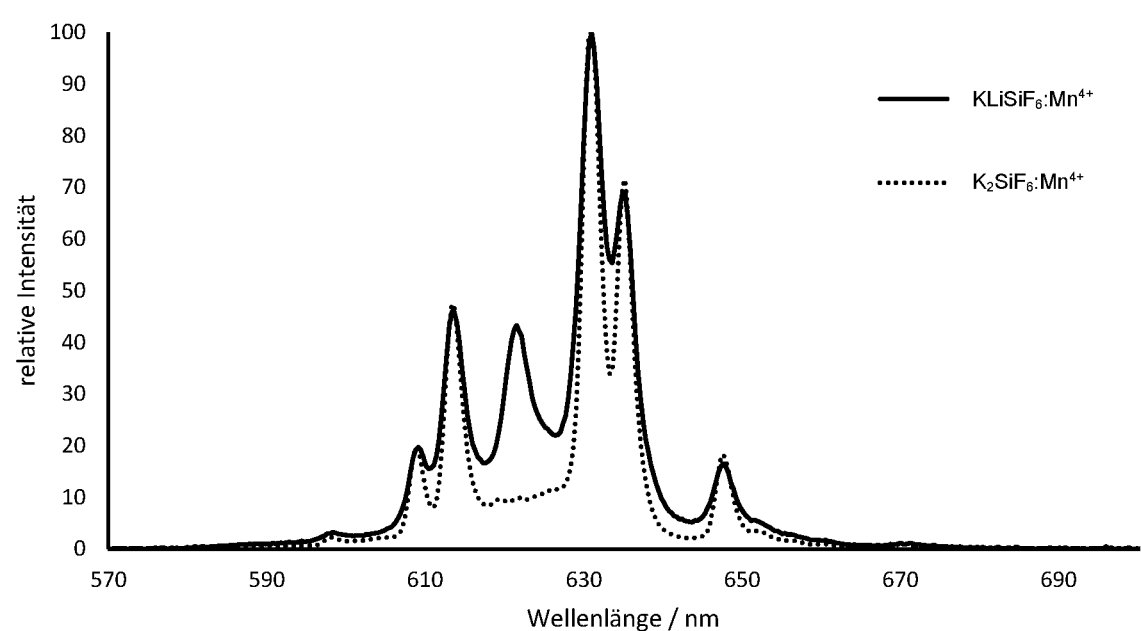
FIG. 4 shows an emission spectrum of the inventive luminophore $KLiSiF_6$:$Mn^{4+}$ compared to $K_2SiF_6$:$Mn^{4+}$.

FIG. 4 shows an emission spectrum of the inventive luminophore $KLiSiF_6$:$Mn^{4+}$ compared to that of $K_2SiF_6$:$Mn^{4+}$. The luminophores were excited with blue laser light ($\lambda_{exc}$=448 nm).

The emission of $K_2SiF_6$:$Mn^{4+}$ differs from the emission of the inventive luminophore $KLiSiF_6$:$Mn^{4+}$. For example the peak at about 622 nm of $KLiSiF_6$:$Mn^{4+}$ is missing in the case of the luminophore $K_2SiF_6$:$Mn^{4+}$. The emission at about 622 nm corresponds to the so-called "zero phonon line", i.e. a transition which occurs without involvement of phonons. In cubic $K_2SiF_6$:$Mn^{4+}$, symmetry dictates that due to the perfectly octahedral Mn environments the corresponding transition is not allowed/possible. By contrast in the inventive luminophore $KLiSiF_6:Mn^{4+}$ the loss of symmetry going to orthorhombic crystal system breaks the perfect octahedral symmetry, thus resulting in a clear intensity of the peak at 622 nm. Since the eye sensitivity curve has a large (negative) gradient in the region of the emission maximum present here ($\lambda_{max}$~631 nm), even small additional signals on the short-wave side of the emission maximum result in a marked difference in luminous efficacy of radiation (LER) as shown in table 2 and FIG. 5.

TABLE 2

Optical data for $K_2SiF_6:Mn^{4+}$ (comparative example) and $KLiSiF_6:Mn^{4+}$.

| | $\Lambda_{dom}$ */ nm | $\lambda_{max}$/ nm | x, y coordinates in CIE-x-y color space | LER/lm $W_{opt}^{-1}$ | rel. LER/% |
|---|---|---|---|---|---|
| $KLiSiF_6:Mn^{4+}$ | 620 | 631 | 0.692 (1); 0.308 (1) | 208 | 102 |
| $K_2SiF_6:Mn^{4+}$ | 621 | 631 | 0.693 (1); 0.307 (1) | 204 | 100 |

* dominant wavelength

The dominant wavelength is a means of describing non-spectral (polychromatic) light mixtures in terms of spectral (monochromatic) light which produces a perceived similar hue. In the CIE color space, the line that connects a point for a particular color and the point CIE-x=0.333, CIE-y=0.333 can be extrapolated such that it meets the outline of the space at two points. The point of intersection closer to said color represents the dominant wavelength of the color as the wavelength of the pure spectral color at this point of intersection. The dominant wavelength is thus the wavelength that is perceived by the human eye.

The optical data of table 2 show that the inventive luminophore $KLiSiF_6:Mn^{4+}$ exhibits a greater luminous efficacy of radiation (LER) compared to $K_2SiF_6:Mn^{4+}$.

Figure 5:
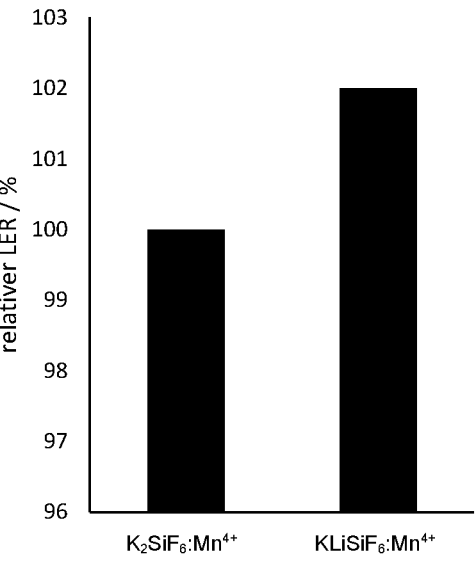
FIG. 5 shows a luminous efficacy of radiation (LER) of $KLiSiF_6$:$Mn^{4+}$ compared to $K_2SiF_6$:$Mn^{4+}$.

The comparison of the relative luminous efficacy of radiation (LER) between $KLiSiF_6:Mn^{4+}$ and $K_2SiF_6:Mn^{4+}$ is represented graphically in FIG. 5.

The working examples described in connection with the figures and the features thereof may also be combined with one another according to further working examples even if such combinations are not explicitly shown in the figures. Furthermore, the working examples described in connection with the figures may comprise additional or alternative features according to the description in the general part.

LIST OF REFERENCE NUMERALS

LED light emitting diode
CRI color rendering index
LER luminous efficacy of radiation
rel. LER relative luminous efficacy of radiation
CCT correlated color temperature
FWHM spectral width of emission, full width at half maximum
ppm parts per million
Ir relative intensity
mol % mole percent
nm nanometers
° C. degrees Celsius
$\lambda_{exc}$ excitation wavelength
$\lambda_{max}$ emission wavelength
$\lambda_{dom}$ dominant wavelength
PXRD powder x-ray diffraction diffractogram

The invention claimed is:

1. A luminophore having the empirical formula $A_{1-y}A'_{y-}LiXF_6:Mn^{4+}$, wherein:
    A=Na, K, Rb, Cs, or combinations thereof;
    A'=Na, K, Rb, Li, Cs, or combinations thereof;
    X=Si, Hf, Zr, Sn, Pb, Ge, or combinations thereof;
    $0{\leq}y{<}1$; and
    A and A' are different,
wherein the luminophore crystallizes in an orthorhombic crystal system.

2. The luminophore as claimed in claim 1 having the empirical formula $A_{1-y}A'_{y}LiSiF_6:Mn^{4+}$, wherein:
    A=Na, K, Rb, Cs, or combinations thereof;
    A'=Na, K, Rb, Li, Cs, or combinations thereof;
    $0{\leq}y{<}1$; and
    A and A' are different.

3. The luminophore as claimed in claim 1 having the empirical formula $ALiSiF_6:Mn^{4+}$, wherein A=Na, K, Rb, Cs, or combinations thereof.

4. The luminophore as claimed in claim 3, wherein A=K, Cs, or both.

5. The luminophore as claimed in claim 1 having the empirical formula $KLiSiF_6:Mn^{4+}$.

6. The luminophore as claimed in claim 1, wherein the luminophore crystallizes in the space group Pbcn.

7. A process for preparing a luminophore having the empirical formula $A_{1-y}A'_{y}LiXF_6:Mn^{4+}$, wherein:
    A=Na, K, Rb, Cs, or combinations thereof;
    A'=Na, K, Rb, Li, Cs, or combinations thereof;
    X=Si, Hf, Zr, Sn, Pb, Ge, or combinations thereof;
    $0{\leq}y{<}1$; and
    A and A' are different, by a solid-state synthesis,
wherein the luminophore crystallizes in an orthorhombic crystal system.

8. The process as claimed in claim 7, wherein no aqueous HF is employed in the solid-state synthesis.

9. The process as claimed in claim 7, wherein the solid-state synthesis is performed at elevated pressure and elevated temperature.

10. The process as claimed in claim 7, wherein the solid-state synthesis is performed at an elevated pressure of 25 kbar to 85 kbar and in at a temperature ranging from 500° C. to 1000° C.

11. The process as claimed in claim 8 for preparing a luminophore having the empirical formula $A_{1-y}A'_{y}LiSiF_6:Mn^{4+}$, wherein the reactants employed are $A_2SiF_6$, where A=Na, K, Rb or Cs, $A'_2SiF_6$,
    where A'=Na, K, Rb, Li and/or Cs, $Li_2SiF_6$ and $X'_2MnF_6$, where X'=Li, Na, K, Rb or Cs, or $ALiSiF_6$, where A=Na, Rb, K or Cs, and $X'_2MnF_6$, where X'=Li, Na, K, Rb or Cs.

12. A conversion LED comprising a luminophore as claimed in claim 1.

13. The conversion LED as claimed in claim 12, further comprising:
    a semiconductor layer sequence adapted to emit electromagnetic primary radiation; and
    a conversion element comprising the luminophore, wherein the conversion element is configured to at least partly convert the electromagnetic primary radiation to electromagnetic secondary radiation.

14. The luminophore as claimed in claim 1, wherein a full width at half maximum of emission bands of the luminophore is below 10 nm.

15. A luminophore having the empirical formula $A_{1-y}A'_{y}$-LiXF$_6$:Mn$^{4+}$, wherein:

A=Na, K, Rb, Cs, or combinations thereof;

A'=Na, K, Rb, Li, Cs, or combinations thereof;

X=Si, Hf, Zr, Sn, Pb, Ge, or combinations thereof;

$0 \le y < 1$; and

A and A' are different, wherein the luminophore has the empirical formula KLiSiF$_6$:Mn$^{4+}$.

\* \* \* \* \*